(12) United States Patent
Reichenbach et al.

(10) Patent No.: US 8,698,255 B2
(45) Date of Patent: Apr. 15, 2014

(54) SEMICONDUCTOR COMPONENT HAVING A MICROMECHANICAL MICROPHONE STRUCTURE

(75) Inventors: Frank Reichenbach, Wannweil (DE); Arnim Hoechst, Reutlingen (DE); Thomas Buck, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/262,905

(22) PCT Filed: Apr. 6, 2010

(86) PCT No.: PCT/EP2010/054519
§ 371 (c)(1),
(2), (4) Date: Dec. 22, 2011

(87) PCT Pub. No.: WO2010/139496
PCT Pub. Date: Dec. 9, 2010

(65) Prior Publication Data
US 2012/0091545 A1   Apr. 19, 2012

(30) Foreign Application Priority Data
Jun. 3, 2009   (DE) .......................... 10 2009 026 677

(51) Int. Cl.
*H01L 29/84* (2006.01)
(52) U.S. Cl.
USPC ............ 257/416; 257/E21.002; 257/E29.324; 257/E21.216; 257/E21.085; 257/627; 438/53; 438/54; 438/695; 374/E7.004; 381/174; 367/181; 310/328
(58) Field of Classification Search
USPC .................. 381/174; 367/181; 257/416, 627; 310/328; 438/695
See application file for complete search history.

(56) References Cited

U.S. PATENT DOCUMENTS

| 2002/0137348 | A1* | 9/2002 | Mlcak | 438/695 |
| 2007/0001551 | A1* | 1/2007 | Izumi et al. | 310/328 |
| 2007/0121972 | A1* | 5/2007 | Suzuki et al. | 381/174 |
| 2008/0232615 | A1* | 9/2008 | Song et al. | 381/174 |

FOREIGN PATENT DOCUMENTS

WO   WO 02007/107736   9/2007

OTHER PUBLICATIONS

Brandon Pillans et al ; Schottky Barrier Contact-Based RF MEMS Switch ; Micro Electro Mechanical Systems, 2007 MEMS. IEEE 20th International Conference on, IEEE, PI, Jan. 1, 2007, pp. 167-170.

* cited by examiner

*Primary Examiner* — Jerome Jackson, Jr.
*Assistant Examiner* — Bo Fan
(74) *Attorney, Agent, or Firm* — Kenyon & Kenyon LLP

(57) ABSTRACT

A simple and cost-effective form of implementing a semiconductor component having a micromechanical microphone structure, including an acoustically active diaphragm as a deflectable electrode of a microphone capacitor, a stationary, acoustically permeable counterelement as a counter electrode of the microphone capacitor, and means for applying a charging voltage between the deflectable electrode and the counter electrode of the microphone capacitor. In order to not impair the functionality of this semiconductor component, even during overload situations in which contact occurs between the diaphragm and the counter electrode, the deflectable electrode and the counter electrode of the microphone capacitor are counter-doped, at least in places, so that they form a diode in the event of contact. In addition, the polarity of the charging voltage between the deflectable electrode and the counter electrode is such that the diode is switched in the blocking direction.

6 Claims, 2 Drawing Sheets

SEMICONDUCTOR COMPONENT HAVING A MICROMECHANICAL MICROPHONE STRUCTURE

FIELD OF THE INVENTION

The present invention relates to a semiconductor component having a micromechanical microphone structure. The micromechanical microphone structure includes at least one acoustically active diaphragm which functions as a deflectable electrode of a microphone capacitor, a stationary, acoustically permeable counterelement which functions as a counter electrode of the microphone capacitor, and means for applying a charging voltage between the deflectable electrode and the counter electrode of the microphone capacitor.

BACKGROUND INFORMATION

Capacitive microelectromechanical system (MEMS) microphones are becoming increasingly important in various fields of application. This is essentially due to the miniaturized design of such components and the possibility for integrating additional functionalities at very low manufacturing costs. The integration of signal processing components such as filters and components for noise suppression, as well as components for generating a digital microphone signal, is particularly advantageous. Another advantage of MEMS microphones is their high temperature stability.

The diaphragm of the microphone structure is deflected by acoustic pressure. This causes the distance between the diaphragm and the stationary counterelement to change, resulting in a change in capacitance of the microphone capacitor. These very small changes in capacitance in the AF range must be converted into a usable electrical signal. The magnitude of the measuring signal is essentially a function of the level of the charging voltage of the microphone capacitor. However, a high charging voltage results in strong attractive forces between the movable diaphragm and the rigid counter electrode which promote electrostatic adherence of the diaphragm to the counter electrode. In the case of uninsulated electrodes, the contact of the diaphragm and the counter electrode results in a short circuit of the microphone capacitor, which may even cause the diaphragm and the counter electrode to fuse together. However, even if the electrodes are provided with a dielectric insulation layer, large-surface contact must be avoided, since the attractive force which acts between the electrodes, and thus the force necessary to separate the electrodes from one another, increases with the size of the contact surface.

Various measures are known in practice for avoiding adherence of the diaphragm to the counter electrode. One option is to provide a particularly stiff diaphragm suspension and/or to increase the distance between the diaphragm and the counter electrode, which already prevents contact of the two electrodes with one another. Both measures have an adverse effect on the sensitivity of the microphone.

In addition, it is known to provide small-surface stops, made of an insulating material, on the diaphragm and/or on the counterelement, so that the required separating force is relatively small. However, this protective measure involves increased manufacturing complexity.

SUMMARY OF THE INVENTION

The present invention provides a simple and cost-effective form of implementing a semiconductor component of the type mentioned at the outset, whose functionality is not impaired even by overload situations in which contact occurs between the diaphragm and the counter electrode.

According to the present invention, this is achieved by counter-doping, at least in places, the deflectable electrode and the counter electrode of the microphone capacitor, so that they form a diode in the event of contact. In addition, the polarity of the charging voltage between the deflectable electrode and the counter electrode is such that this diode is switched in the blocking direction.

A short circuit of the microphone capacitor in overload situations is thus avoided, even without dielectric coating of the electrodes. The capacitor structure is not damaged; in particular, the two electrodes do not fuse together, since current is not able to flow through the microphone capacitor even if there is contact between the diaphragm and the counter electrode. This contributes to increased service life stability of the component according to the present invention.

The measures according to the present invention have also proven to be advantageous due to the fact that the charging conditions which develop in the event of contact between the two electrodes of the microphone capacitor counteract permanent adherence of the deflectable diaphragm to the stationary counter electrode.

The doping of the two electrodes of the microphone capacitor may be easily designed in such a way that the diode pn transition is located at the interface between the two electrodes. Alternatively, the diode pn transition may be implemented within one of the two electrodes.

In one advantageous refinement of the semiconductor component according to the present invention, stop knobs are provided on the movable electrode and/or on the counter electrode. With the aid of such stop knobs, it is possible on the one hand to limit the diaphragm deflection in overload situations. On the other hand, the stop knobs simplify detachment of the movable diaphragm from the counter electrode in the event of contact.

However, such stop knobs have also proven to be advantageous in implementing the doping according to the present invention, since they define the contact points between the two electrodes of the microphone capacitor, and thus define the regions of these electrodes to be doped. As previously mentioned, these regions may be doped in such a way that the pn transition of the diode which results in the event of contact is located either at the interface between the electrodes of the microphone capacitor or within one of the two electrodes of the microphone capacitor.

For similarly doped electrodes, a diode pn transition may be easily implemented at the interface between the electrodes by redoping the stop knobs or by redoping the electrode regions situated opposite from the stop knobs.

When the two electrodes of the microphone capacitor have opposite basic doping, the diode pn transition may be easily implemented within one of the two electrodes by redoping the stop knobs or the electrode regions situated opposite the stop knobs, so that they have doping as the oppositely situated electrode.

DETAILED DESCRIPTION

Figure 1:
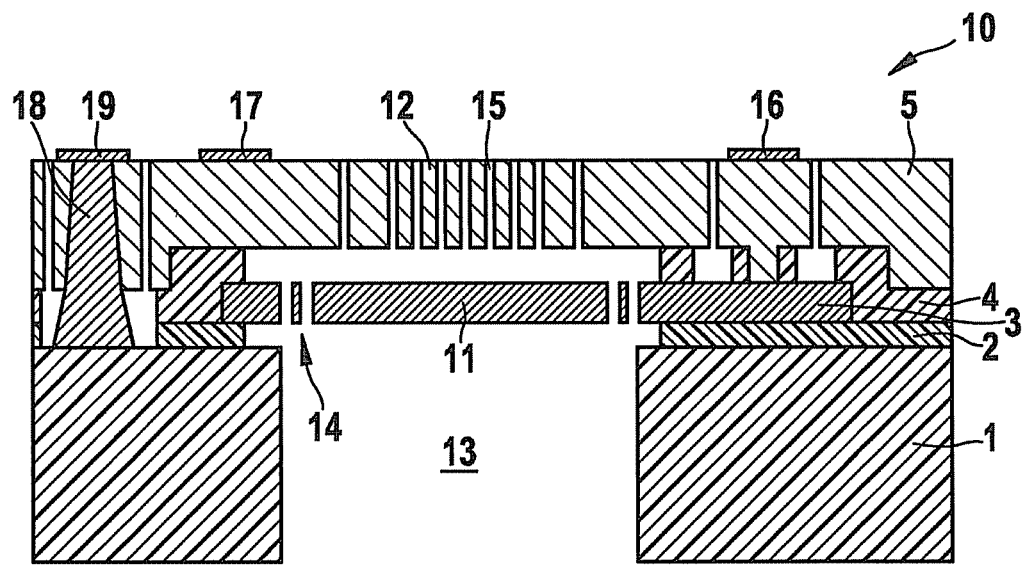
FIG. 1 shows a schematic sectional illustration of a semiconductor component according to the present invention.

Semiconductor component 10 illustrated in FIG. 1 includes a micromechanical microphone structure having a deflectable, acoustically active diaphragm 11 and a stationary, acoustically permeable counterelement 12, also referred to as a backplate. In the present case, diaphragm 11 and counterelement 12 are implemented in a layered structure on a semiconductor substrate 1. A sound opening 13 is provided in the back side of semiconductor substrate 1 which extends over the entire thickness of semiconductor substrate 1 and which is bridged by diaphragm 11 situated on the top side of semiconductor substrate 1. Diaphragm 11 is implemented in a thin polysilicon layer 3, and is electrically insulated with respect to semiconductor substrate 1 via a first insulation layer 2. The deflectability of thin diaphragm 11 is facilitated by its spring suspension 14 provided in polysilicon layer 3. In contrast, counterelement 12 is provided in a relatively thick epi-polysilicon layer 5 above diaphragm 11, and is fixedly connected to the layered structure. The counterelement is electrically insulated with respect to diaphragm 11 as well as to semiconductor substrate 1 via a second insulation layer 4. The thickness of this second insulation layer 4 also determines the distance between diaphragm 11 and counterelement 12 in the neutral state. Through openings 15 are provided in the middle region of counterelement 12, so that counterelement 12 is acoustically permeable and the acoustically related deflections of diaphragm 11 are not impaired.

Diaphragm 11 and counterelement 12 form the electrodes of a microphone capacitor whose capacitance changes according to the distance between diaphragm 11 and counterelement 12. To detect the changes in capacitance of the microphone capacitor, a charging voltage, also referred to as bias voltage, is applied between diaphragm 11 and counter electrode 12.

Electrodes 11, 12 and semiconductor substrate 1 are contacted via the top side of the component. The contacting of diaphragm 11 is implemented in the form of a connecting pad 16 on an electrically insulated region of epitaxial layer 5 which rests directly on polysilicon layer 3 and is thus electrically connected to diaphragm 11. Only one connecting pad 17 on epitaxial layer 5 is necessary for contacting counterelement 12. A feedthrough 18 to semiconductor substrate 1 having a connecting pad 19 on the surface has been produced in another electrically insulated region of epitaxial layer 5.

According to the present invention, diaphragm 11 as a deflectable electrode and backplate 12 as a counter electrode of the microphone capacitor are counter-doped. Thus, diaphragm 11 may be p- or p$^+$-doped by boron occupancy, for example, while backplate 12 is n- or n$^+$-doped. Likewise, movable electrode 11 may be n- or n$^+$-doped, and counter electrode 12 may be p- or p$^+$-doped. Since neither diaphragm 11 nor backplate 12 is provided with an insulation layer, these two electrodes 11 and 12 form a diode in the event of contact. According to the present invention, the polarity of the bias voltage is selected in such a way that this diode is switched in the blocking direction. A short circuit of the microphone capacitor is thus prevented. Since no current flows between diaphragm 11 and counter electrode 12, the microphone structure is also not destroyed due to fusing of its components.

Figure 2:
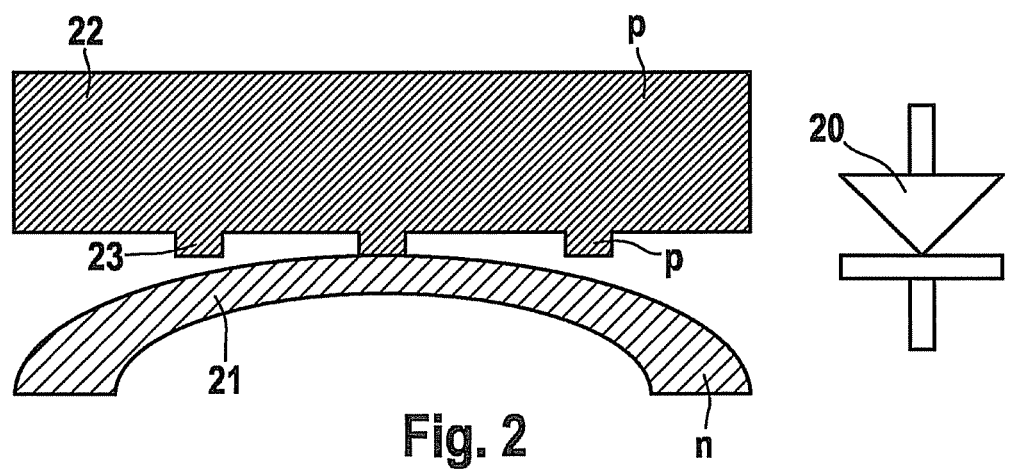
FIGS. 2 through 4 each show a schematic sectional illustration of a microphone capacitor in an overload situation for illustrating the mode of operation of various doping variants.
Figure 3:
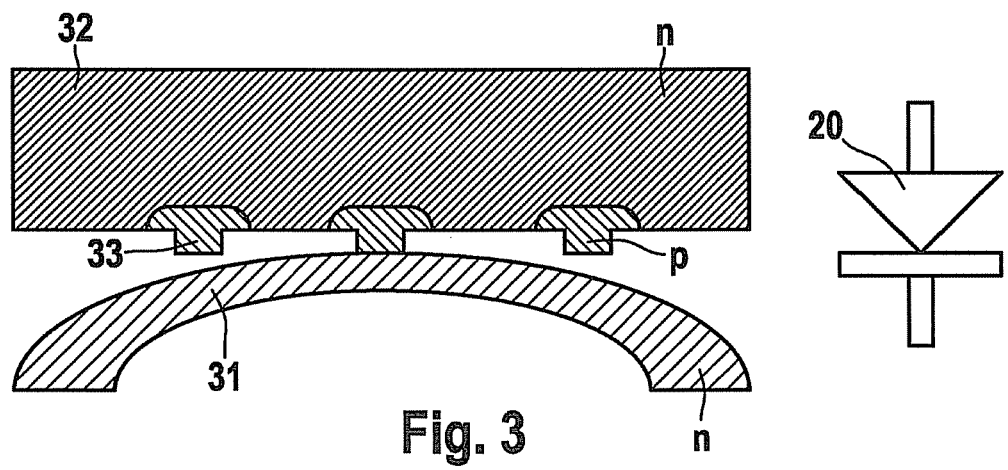
Figure 4:
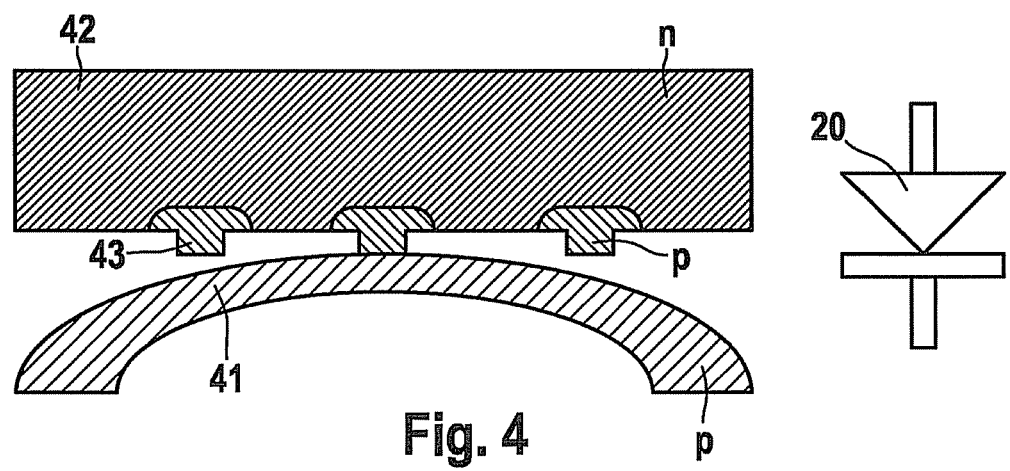

FIGS. 2 through 4 show only diaphragms 21, 31, and 41 and counterelements 22, 32, and 42, respectively, of a semiconductor component according to the present invention in an overload situation. Stop knobs 23, 33, and 43, which are provided on the bottom side of counterelements 22, 32 and 42, respectively, have been produced in an epitaxial process in the same way as for counterelements 22, 32, and 42, and are made of epi-polysilicon.

In the case of FIG. 2, counterelement 22 together with stop knobs 23 is p-doped, while diaphragm 21 is n-doped. In the present case, diaphragm 21 is arched so greatly that it contacts middle stop knob 23 of counterelement 22. In this contact region, the two electrodes 21 and 22/23 of the microphone capacitor form a diode on account of their opposite doping. Due to the polarity according to the present invention of the charging voltage of the microphone capacitor, this diode is switched in the blocking direction, as indicated by graphic symbol 20 in the right half of the figure.

In contrast, in the case of FIG. 3, counterelement 32 and diaphragm 31 are similarly doped. Namely, in the present case both electrodes 31, 32 have been provided with n-doping as basic doping. Only stop knobs 33 and an adjacent trough-shaped electrode region are p-doped. This p-doping may be produced, for example, in a targeted implantation process. Here as well, n-doped diaphragm 31 together with middle p-doped stop knob 33 forms a diode which is switched in the blocking direction, and whose pn transition is located at the interface between diaphragm 31 and stop knob 33.

In the doping variant illustrated in FIG. 4, counterelement 42 and diaphragm 41 have opposite basic dopings, the same as in the case of FIG. 2. Thus, counterelement 42 is n-doped, while diaphragm 41 is p-doped. However, here as well stop knobs 43 and an adjacent trough-shaped electrode region have been redoped, so that stop knobs 43 are p-doped, the same as oppositely situated diaphragm 41. In this case as well, the contact between middle stop knob 43 and diaphragm 41 results in a diode which is switched in the blocking direction. Unlike the two doping variants described above, however, the pn transition of this diode is located within counterelement 42, in particular between the n-doped region of counterelement 42 and the p-doped region in abutment with middle stop knob 43.

What is claimed is:

1. A semiconductor component having a micromechanical microphone structure, comprising:
    an acoustically active diaphragm which functions as a deflectable electrode of a microphone capacitor;
    a stationary, acoustically permeable counterelement which functions as a counter electrode of the microphone capacitor; and
    means for applying a charging voltage between the deflectable electrode and the counter electrode of the microphone capacitor,
    wherein at least a portion of the deflectable electrode is doped opposite from at least a portion of the counter electrode of the microphone capacitor so that the deflectable electrode and the counter electrode form a diode in the event of contact, and a polarity of the charging voltage between the deflectable electrode and the counter electrode is such that the diode is switched in a blocking direction.

2. The semiconductor component according to claim 1, wherein a pn transition of the diode is situated at an interface between the two electrodes of the microphone capacitor.

3. The semiconductor component according to claim 1, wherein a pn transition of the diode is situated within one of the two electrodes of the microphone capacitor.

4. The semiconductor component according to claim 1, wherein at least one of (a) a portion of the deflectable electrode and (b) a portion of the counter electrode is formed as stop knobs.

5. The semiconductor component according to claim 4, wherein the deflectable electrode and counter electrode of the microphone capacitor have a similar basic doping to each other, and a doping opposite from the stop knobs or the portions of the deflectable electrode and the counter electrode situated opposite the stop knobs.

6. The semiconductor component according to claim 4, wherein the two electrodes of the microphone capacitor have an opposite basic doping, and the stop knobs or electrode regions situated opposite the stop knobs are redoped so that they have a similar doping as an oppositely situated electrode.

* * * * *